United States Patent
Castro (10) Patent No.: US 8,477,555 B2
(45) Date of Patent: Jul. 2, 2013

(54) DESELECT DRIVERS FOR A MEMORY ARRAY

(75) Inventor: Hernan A. Castro, Shingle Springs, CA (US)

(73) Assignee: Intel Corporation, Santa Clara, CA (US)

(*) Notice: Subject to any disclaimer, the term of this patent is extended or adjusted under 35 U.S.C. 154(b) by 197 days.

(21) Appl. No.: 13/173,068

(22) Filed: Jun. 30, 2011

(65) Prior Publication Data

US 2013/0003449 A1     Jan. 3, 2013

(51) Int. Cl.
*G11C 8/00*     (2006.01)

(52) U.S. Cl.
USPC ............ 365/230.06; 365/230.08; 365/230.03; 365/231

(58) Field of Classification Search
USPC .................... 365/230.06, 230.08, 230.03, 231
See application file for complete search history.

(56) References Cited

U.S. PATENT DOCUMENTS

| | | | | | |
|---|---|---|---|---|---|
| 5,566,127 | A | * | 10/1996 | Hoshizaki | 365/230.06 |
| 5,604,711 | A | * | 2/1997 | Cheung | 365/230.06 |
| 5,648,933 | A | * | 7/1997 | Slemmer | 365/200 |
| 5,742,546 | A | * | 4/1998 | Devin | 365/194 |
| 5,761,148 | A | * | 6/1998 | Allan et al. | 365/230.06 |
| 5,781,497 | A | * | 7/1998 | Patel et al. | 365/230.06 |
| 5,923,609 | A | * | 7/1999 | Roscher et al. | 365/230.06 |
| 6,392,956 | B2 | * | 5/2002 | Matsui et al. | 365/230.06 |
| 2012/0188838 | A1 | * | 7/2012 | Cheng et al. | 365/230.06 |
| 2012/0236676 | A1 | * | 9/2012 | Zeng et al. | 365/230.06 |

\* cited by examiner

*Primary Examiner* — Viet Q Nguyen
(74) *Attorney, Agent, or Firm* — Cool Patent, P.C.; Kenneth J. Cool (57) ABSTRACT

Asymmetric select and deselect drivers are provided for select lines driven to a resistive cross-point memory array. An address may be fully decoded to determine the active select driver, but a partial decode may be performed for the deselect drivers. Some embodiments may manage the odd and even deselect drivers as two sets of drivers and some embodiments may use sub-optimal transistors as the deselect drivers to save die area. Some embodiments may implement the deselect drivers as modified memory elements to reduce die area further.

20 Claims, 5 Drawing Sheets

FIG. 6

DESELECT DRIVERS FOR A MEMORY ARRAY

TECHNICAL FIELD

The present subject matter relates generally to the field of electronics, including semiconductor memory devices. More specifically, the present subject matter relates to providing a deselect voltage to select lines for a memory array.

BACKGROUND

Memory for computers or other electronic devices can include blocks of memory cells integrated into a larger integrated circuit or stand-alone integrated circuits. There are many different types of memory including random-access memory (RAM), read only memory (ROM), dynamic random access memory (DRAM), static RAM (SRAM), synchronous dynamic RAM (SDRAM), flash memory and phase change memory (PCM). Many semiconductor memory technologies arrange individual memory cells into arrays that may be accessed using bit lines (or column select lines) that connect to columns of memory cells in the array and word lines (or row select lines) that connect to rows of memory cells in the array.

Many types of memory may be accessed by providing a select voltage on the appropriate bit line and/or word line. Some memory technologies, such as resistive cross-point memory technologies including PCM, may require a deselect voltage to be driven on the inactive word lines and/or bit lines to achieve proper biasing during a memory access.

BRIEF DESCRIPTION OF THE DRAWINGS

The accompanying drawings, which are incorporated in and constitute part of the specification, illustrate various embodiments of the claimed subject matter. Together with the general description, the drawings serve to explain the principles of the claimed subject matter. They should not, however, be taken to limit the claimed subject matter to the specific embodiments described, but are for explanation and understanding of the claimed subject matter. Such subject matter may be understood by reference to the following detailed description when read with the accompanying drawings in which:

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of the claimed subject matter. These descriptive terms and phrases are used to convey a generally agreed upon meaning to those skilled in the art unless a different definition is given in this specification.

Figure 1:
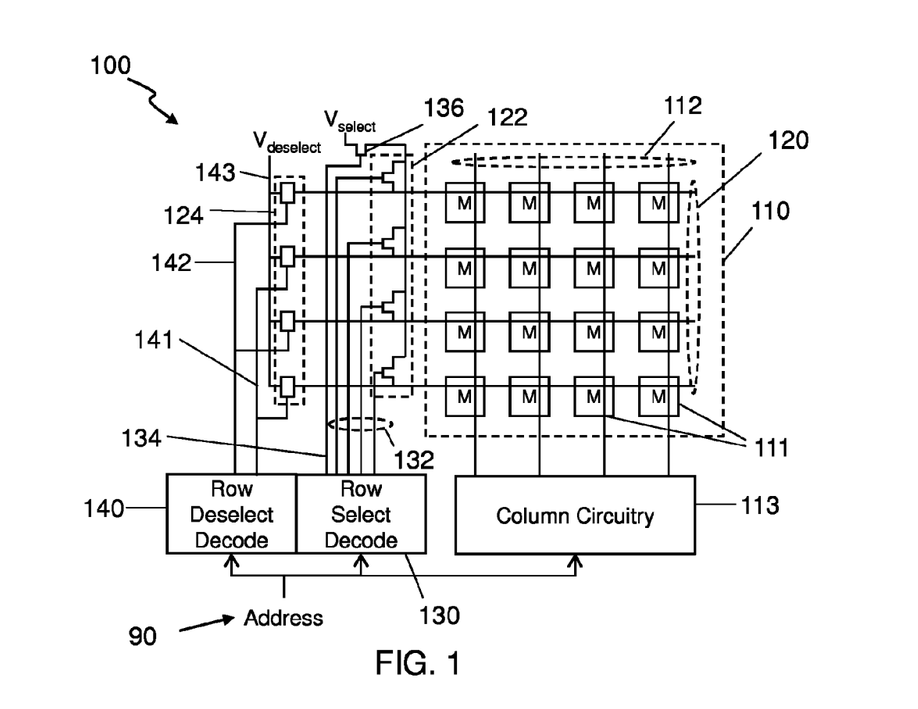
FIG. 1 is a circuit diagram showing a memory array with select drivers and an embodiment of deselect drivers in accordance with one or more embodiments.

FIG. 1 is a circuit diagram of a memory circuit 100 with a memory array 110, select drivers 122 and an embodiment of deselect drivers 124. The memory array 110 may comprise an array of memory cells 111. Any type of memory technology may be used including, but not limited to, dynamic random access memory (DRAM), flash memory, and phase change memory (PCM), memristor memory, or other types of memory. Although FIG. 1 shows a 4×4 array of 16 memory cells 111, the memory array 110 may contain any number of memory cells 111, and be not have the same number of columns as rows. The memory array 110 may typically contain at least many millions of memory cells 111. The memory array 110 may have a number of select lines that may cross the memory array 110 in two directions. The select lines may be referred to as row select lines, or word lines 120, and column select lines, or bit lines 112, although other names may be used. Respective memory cells 111 in the memory array 110 may be coupled to one word line 120 and one bit line 112. By applying a select voltage on a word line and a bit line, the memory cell 111 that is coupled to those two lines may be accessed to read or write the memory cell 111. The exact voltage and timing sequence for the select lines may vary depending on the memory technology used, and some memory technologies may use additional lines to access an individual memory cell 111 or group of memory cells 111.

An address 90 may be received by the memory circuit 100 and distributed to column circuitry 113 and row circuitry 130, 140 to be decoded. Sections of the address 90 may be decoded in various ways in one or more embodiments. While the row circuitry is discussed in detail herein, the column circuitry 113 may be implemented using similar embodiments or using different techniques.

In some embodiments, the row select decode 130 may fully, or nearly fully, decode the address to provide $2^n$ select control lines 132 for n address bits that may be used to control the select drivers 122 so that at least one select driver is enabled and the at least one or more other select drivers are disabled. In other embodiments, a section of address may be split into multiple subsections to provide a cascaded decode. As an example, an 8 bit section of address 90 for use in selecting a particular word line 120 of the 256 word lines of the memory array 100 may be split into two 4 bit subsections. The low order 4 bits may be decoded into 16 select control lines 132 that drive 16 sets of 16 select drivers 122 so that one or more of the 16 outputs drive 16 select drivers 122. The high order 4 bits may be decoded into another 16 outputs that drive the gate of a control field-effect transistor (FET) 136. The control FETs 136 may have their sources connected to $V_{select}$ and their drains connected to one set of 16 select drivers 122. In such an arrangement, one select line is connected to $V_{select}$ and the others are isolated during a memory access. If more address bits need to be decoded, additional cascades of decoding may be provided. The row select decode 130 of FIG. 1 shows two bits of address decoded into four select control lines 132 and a single output 134 for controlling a control FET 136 but one of ordinary skill could easily create a decoder for any number of address bits.

One or more of the select control lines 132 may drive the gates of one or more select drivers 122. The select drivers 122 may be constructed using any applicable technology including metal oxide semiconductor field-effect transistors (MOSFET), chalcogenide devices, bipolar junction transistors, or other types of electronic devices. The select drivers may be designed to handle the voltage and current requirements for selecting a memory cell 111 or the memory array 110 which may depend at least in part on the memory technology used, but in one embodiment the select driver may be an n-channel MOSFET. A select driver may be provided for one or more word line 120 of the memory array 110. A control FET 136 controlled by output 134 may be used to enable the $V_{select}$ voltage to be provided to a group of select drivers 122

The row deselect decode 140 may only partially decode the row section of the address 90 to minimize circuitry, routing area, and complexity. In the embodiment shown, the row deselect decode 140 may only evaluate the low order address bit of the section of address 90 that determines which row of the memory array 110 is being accessed. The low order address bit may be used to determine whether to drive the even deselect control 142 or the odd deselect control 141 to an active state. Other embodiments may not decode an address at all and simply may enable all or nearly all the deselect drivers together or may partially decode the address 90 in some other way to create two or more deselect control lines.

In some embodiments, the odd deselect control 141 may control the odd deselect drivers and the even deselect control 142 may control the even deselect drivers allowing four different combinations of deselect divers to be active: all or nearly all deselect drivers active, odd deselect drivers active, even deselect drivers active and no deselect drivers active. A deselect driver may be provided for one or more word lines 120 of the memory array.

For some memory technologies, the voltage and/or current requirements for deselected word lines may be much lower than that for selected word lines. Since the minimum geometry of a transistor is dependent on the current that may flow through the transistor and the maximum voltage that may be experienced between various features, the deselect drivers 124 may be smaller than select drivers 122. Such deselect drivers 124 may be a MOSFET optimized using standard design rules for the process used given for the expected voltage and current requirements. In some embodiments the deselect drivers 124 may be implemented as p-channel MOSFETs and in other embodiments the deselect drivers 124 may be implemented as n-channel MOSFETs.

To allow the deselect drivers 124 to be even smaller, in some embodiments, the deselect drivers 124 may be sub-optimal MOSFETs that may have high leakage currents under some operating conditions due to smaller than optimal geometries of the transistors used for the deselect drivers 124. Other parameters of the sub-optimal MOSFETs may also be less than ideal such as higher "on" resistance or other variance from the optimized MOSFETs. Any transistor, including MOSFETs, with any dimension smaller than the standard design rules would indicate for a targeted operating condition may be considered a sub-optimal transistor.

One impact of such sub-optimal MOSFETs is that the select drivers 122 may involve a slightly higher current during some portion of the selection process to account for leakage through the sub-optimal MOSFETs of the select driver 124 that is connected to the active word line 120. Although the leakage may only have a small impact, or no impact at all, on the current delivered from the select drivers, the leakage through the sub-optimal MOSFETs may be many times higher than the leakage current of an optimized MOSFET for a given process technology. One result is that the suboptimal MOSFETs may be significantly smaller than the optimized MOSFETs designed for the expected voltage and current using standard design rules for the given process technology.

Other embodiments may use devices other than a MOSFET for deselect drivers 124. In some embodiments, bipolar junction transistors (BJT) may be used. As with the MOSFET implementation, the BJT used for the deselect drivers 124 may be sub-optimal to save space. Other embodiments may use chalcogenide devices for the deselect drivers 124 and yet other embodiments may use some type of variable resistor or other switchable and/or variable device for the deselect drivers 124. In some embodiments the deselect drivers 124 may be implemented to the sides of the memory array 110 while other embodiments may implement the deselect drivers 124 within the memory array 110 itself using modified memory elements.

Figure 2:
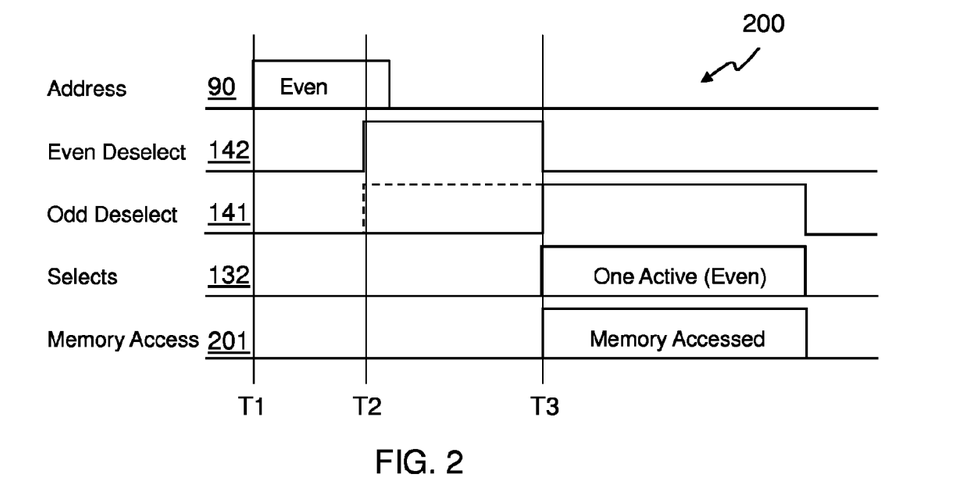
FIG. 2 is a timing diagram showing how various lines behave before and during a memory access in accordance with one or more embodiments.

FIG. 2 is a timing diagram 200 showing how various lines behave before and during a memory access. An even address 90 may be received at time T1 in this example. The even deselect control 142 may be driven to an active state at time T2, which is shown as a high level in the timing diagram 200. In some embodiments the odd deselect control 141 may also be driven to an active state at time T2 and in some embodiments, both the even deselect control 142 and odd deselect control 141 may be driven active even before the address 90 is received.

The memory access timing may be controlled by control circuitry not shown in FIG. 1 that is designed for the specific memory technology used and should be well understood by one of ordinary skill in the art. As the memory is being accessed, as shown by the Memory Access signal 201, at time T3, the select control line 132 controlling the select driver 122 that is coupled to the word line 120 that is coupled to the addressed memory cell 90 is driven active while the other select lines are kept inactive. Because, the address 90 is an even address, the active select control line 132 is an even select control line. So to avoid a conflict between the active select driver 122 and any deselect driver 124, the even deselect control 142 is driven inactive for the memory access starting at time T3. After the memory access has completed, the select control lines 132 for may be driven inactive until the next memory access. Depending on the embodiment, the deselect control lines 141, 142 may be driven to any of the possible four conditions described above but in at least one embodiment, both the even deselect control line 142 and the odd deselect control line 141 may be driven active until the next memory access to keep the word lines 120 at $V_{deselect}$. Other embodiments may allow a single word line to be driven by both a select driver 122 and a deselect driver 124 at the same time and may be designed so that the larger select driver 122 can overdrive the deselect driver 124 and ensure that the proper word line 120 is driven to $V_{select}$. This overdrive of the deselect driver may, in some embodiments, be achieved by modulating the conductance of the deselect drivers during the critical phases of selection. In other embodiments, the voltage source connected to the deselect drivers may be controlled during critical phases of the selection.

In the following descriptions, the term 'n-well' is used in a very general manner to describe the n-type source or drain diffusion of MOSFET technology. Additionally, the choice of P or N type devices in the following descriptions are done for convenience and may be modified depending on the particulars of the memory and CMOS technology.

Figure 3A:
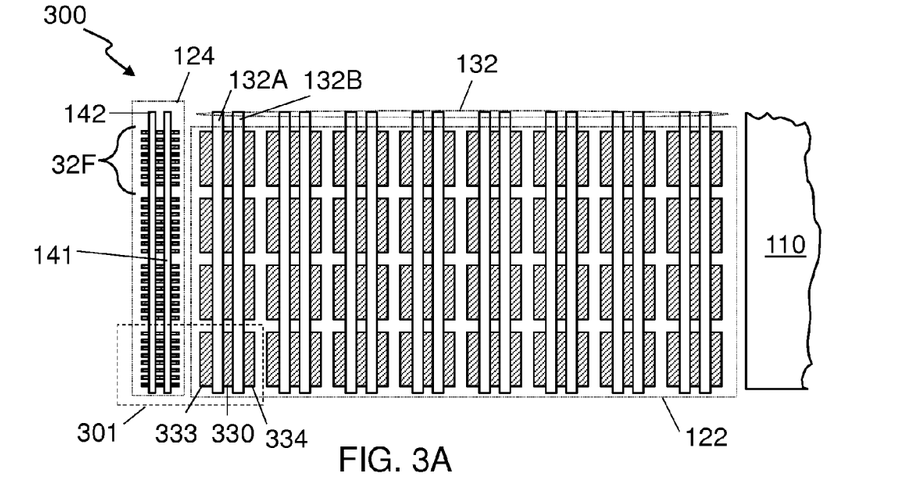
FIG. 3A shows a portion of a layout of an integrated circuit (IC) using an embodiment with asymmetric select and deselect drivers in accordance with one or more embodiments.

FIG. 3A shows a layout of a portion of an integrated circuit (IC) 300 using an embodiment with asymmetric select and deselect drivers. The word lines 120 are not shown in this drawing for clarity. The memory array 110 is partially shown to the right of the select drivers 122. Four groups of sixteen select drivers are shown in FIG. 3A that are controlled by sixteen select control lines 132 implemented in polysilicon including the first select control line 132A and the second select control line 132B. The select control lines 132 may act as gates for n-channel MOSFETS that may be used for the select drivers 122. One pair of select drivers 122 is included in the layout section 301 that includes a common source n-well 330, a first drain n-well 333 and a second drain n-well 334.

Four groups of sixteen deselect drivers 124 may be matched in height to the four groups of sixteen select drivers 122. One group of select drivers having 8 double MOSFETS arranged in a row may have a height of 32F, where "F" is the minimum feature dimension for a given process technology such as 22 nanometers (nm), or 32 nm, or other dimension depending on the process technology used. The height may be chosen to match the pitch of the memory array, which in the embodiment shown may be 2F, allowing the height of the row of eight pairs of select drivers 122 to have the same height as sixteen memory cells 111. Sixteen deselect drivers 124 may be designed to match the same height while providing the narrowest embodiment possible to minimize the die area requirement of the IC 300. The deselect drivers 124 may be controlled by the odd deselect control 141 and the even deselect control 142 implemented in polysilicon and acting as the gates for sub-optimal MOSFETS used as the deselect drivers 124. It should be noted that while resistive cross-point memory technology may generally be drawn with an array pitch of 2F, various embodiments may use a different pitch for the memory array. The concepts described herein are not dependent on the specific geometries of the examples and may be applied to different geometries as well.

If select drivers 122 and deselect drivers 124 used the same dimensions for their MOSFETs, the deselect drivers 124 would take the same amount of space as the select drivers 122. In one embodiment, optimized MOSFETs for the deselect drivers 124 may be about 8F×32F per pair. As a comparison, the MOSFETs used for the select driver 122 may be about 32F×32F per pair, allowing the deselect drivers 124 to take about 25% as much space as the select drivers 122 if optimized MOSFETs are used for deselect drivers 124. A pair of sub-optimal MOSFETs usable for the deselect drivers 124 in the same technology may be about 4F×10F as shown in FIG. 3A, using less than about one sixth of the space of the optimized MOSFET. So deselect drivers 124 using sub-optimal MOSFETs may take less than about 5% as much space as the select drivers 122. Other embodiments may use differing ratios of space for deselect drivers as compared to select drivers.

Figure 3B:
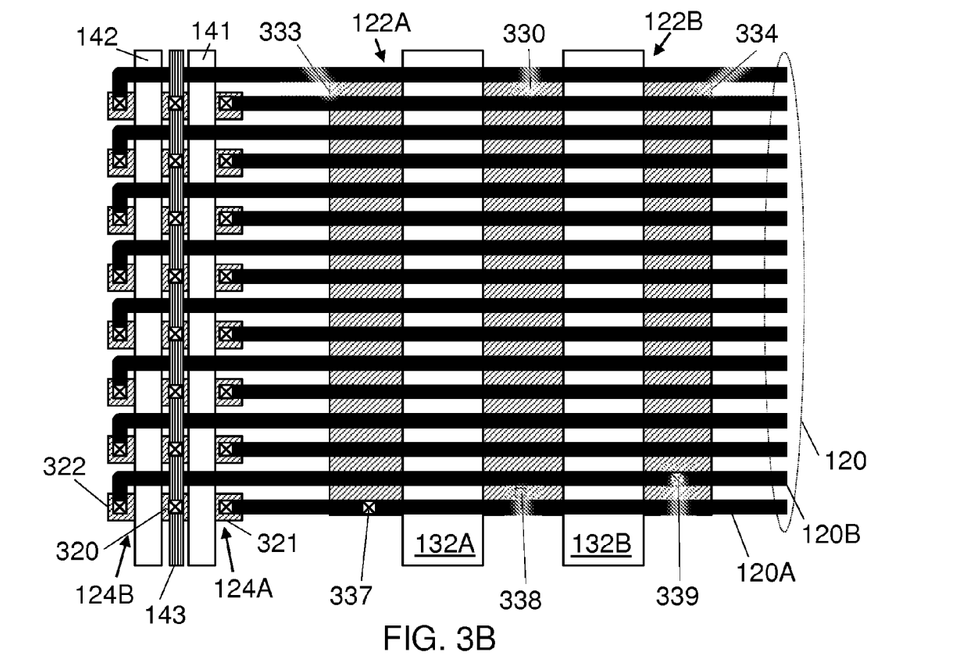
FIG. 3B is a more detailed view of a section of the layout of FIG. 3A in accordance with one or more embodiments.

FIG. 3B is a more detailed view of section 301 of the layout of the IC 300 of FIG. 3A with the word lines 120 included. The word lines 120 may continue to the right to connect to the other 14 select drivers 122 in the group and then on to the memory array 110. The word lines 120 may be implemented on a metal layer allowing for 1F lines and 1F spaces to allow the pitch of the memory array to be matched. The even word lines are interleaved with the odd word lines meaning that the two sets of word lines spatially alternate, with one or more even word line being adjacent to two odd word lines. By interleaving the two sets of word lines, the word lines adjacent to a word line being driven by a select driver may be actively driven by deselect drivers and minimizing any voltage changes on those lines due to capacitive or inductive coupling. The word lines that are isolated from any voltage source during the memory access and are charged to $V_{deselect}$ may be protected from capacitive or inductive coupling to the word line being driven by the select driver by having a word line being driven to $V_{deselect}$ immediately adjacent to it on both sides.

The first select driver 122A is implemented using the common source n-well 330, the select control line 132A as the gate, and first drain n-well 333. The drain of the first select driver 122A is connected to the first select line 120A by via 337. The second select driver 122A is implemented using the common source n-well 330, the select control line 132B as the gate, and second drain n-well 334. The drain of the second select driver 122B is connected to the second select line 120B by via 339. The common source n-well 330 is coupled to a control FET 136 through via 338 or other connection. The location of the control FET 136 may be dependent on the overall size of the memory array 110 and the routing between the control FET 136 and the common source n-well 330 is dependent on the location of the control FET 136 as well as the routing layers that may be available in a particular process technology, and are therefore not shown in FIG. 3A or 3B.

The first deselect driver 124A is implemented using common source n-well 320, the first deselect control 141 as the gate and n-well drain 321. The second deselect driver 124B is implemented using common source n-well 320, the second deselect control 142 as the gate and n-well drain 322. The drain of the first deselect driver 124A is connected to the first select line 120A and the drain of the second deselect driver 124B is connected to the second select line 120B. The other fourteen deselect drivers 124 of the group shown are configured similarly. The sources of the eight pairs of select drivers 124 are connected to $V_{deselect}$ by metal line 143.

Figure 4:
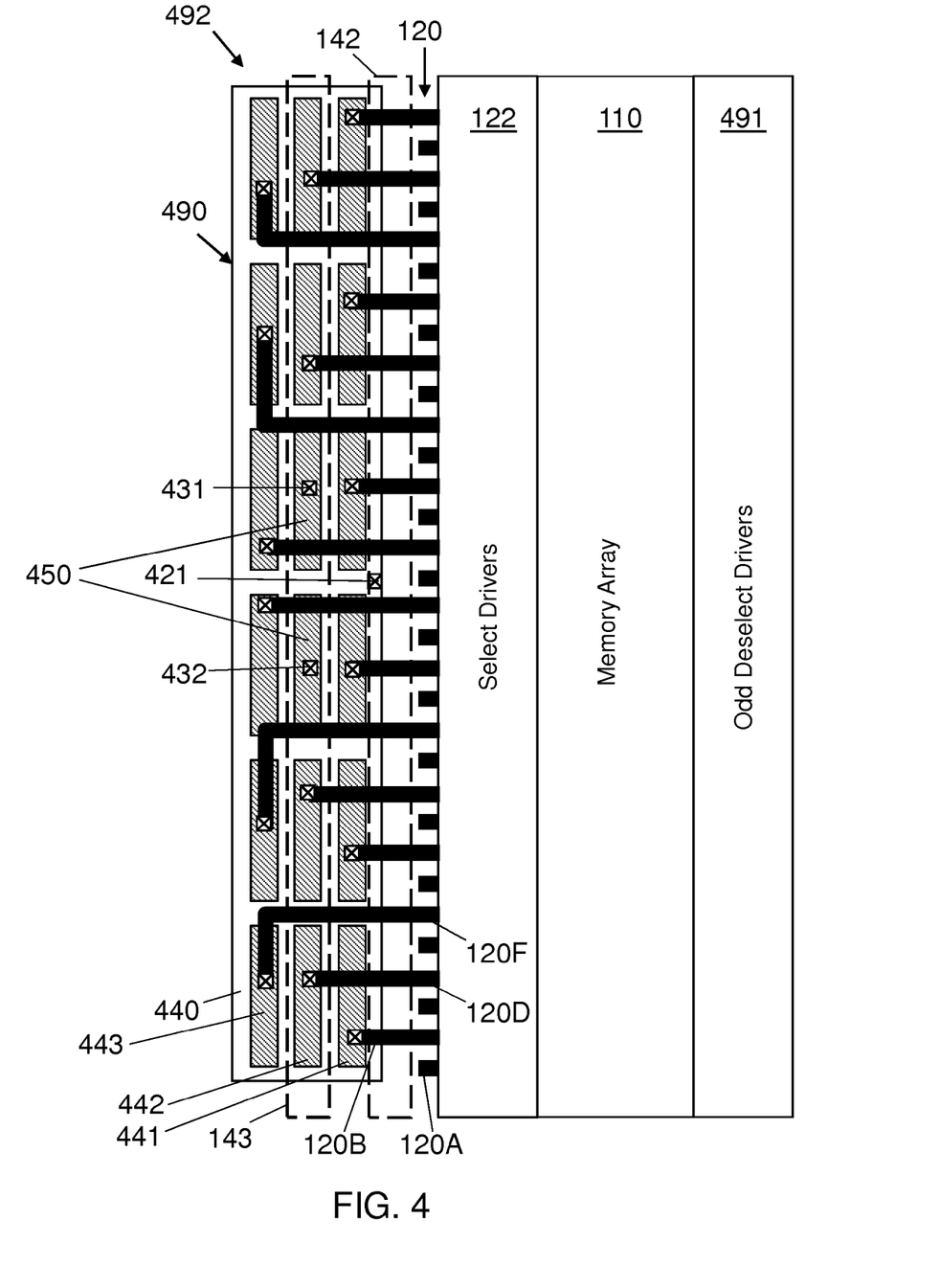
FIG. 4 is a layout of an alternative embodiment of deselect drivers using distributed drain field-effect transistors (DDFETs) in accordance with one or more embodiments.

FIG. 4 shows a layout of an alternative embodiment of deselect drivers 492 using distributed drain field-effect transistors (DDFETs) 490. The memory array 110 may have one set of select drivers 122 to the left of the memory array 110 much like the layout of FIG. 3A. The odd deselect drivers 491 may be located to the right of the memory array 110 and the even deselect drivers 492 may be located to the left of the select drivers 122. Other embodiments may place both odd or even deselect drivers on the same side of the memory array 110. The choice of location is driven by the specifics of the design rules available for the technology used. It should be noted that the memory array 110, select drivers 122 and odd deselect drivers 491 are not to scale with the rest of the drawing. It should also be noted that the connection of the word-lines to the DDFET terminals is shown as a direct connection with a single interconnect layer. In practice multiple interconnect layers may be used to achieve this connection efficiently and may use much less area than the interconnect scheme shown.

The word lines 120 cross over select drivers 122 and the memory array 110 and become accessible to the odd deselect drivers 491 and even deselect drivers 492 with the odd deselect drivers 491 connecting to the odd word lines such as the first word line 120A, and the even word lines such as 120B, 120D, 120F connecting to the even deselect drivers 492. In the embodiment shown, the deselect drivers are implemented using distributed drain field effect transistors (DDFET) 490. The DDFET 490 has a common n-well source or sources 450 connected to $V_{deselect}$ by metal line 143 through vias 431, 432. In FIG. 4 the metal line 143 does not connect to the other vias that are shown as the other vias terminate at the word lines 120. The DDFET 490 also has a unified gate 440 that may be made of a grid of polysilicon connected to the even deselect control 142 by via 421 with individual n-wells for drains, 441, 442, 443. Individual n-well drains may act as a sub-optimal FET and provide a connection to $V_{deselect}$ if the gate 440 is driven high. If the gate 440 is driven low, the individual FETs shut off, albeit with some potential for higher leakage current, isolating the connected word lines from $V_{deselect}$. In the embodiment shown, the first n-well 441 is connected to the second word line 120B, the second n-well 442 is connected to the fourth word line 120D, the third n-well 443 is connected to the sixth word line 120F, and so on.

The geometry of the DDFET 490 may be determined in much the same way as the sub-optimal transistor with smaller geometries than that which might be acceptable for fully optimized transistors given the same operating conditions. DDFETs may also be used for the odd deselect drivers 491 and placing the even and odd deselect drivers on opposite sides of the memory array 110 may facilitate easy routing. While the DDFET shown is an n-channel device, a DDFET may also be fabricated as a p-channel device. Any device with a common gate and more than twice as many drain wells as source wells may be considered a DDFET. Other embodiments of DDFETs may use a different arrangement of wells such as 2×9 or 4×5 instead of the 3×6 array of wells shown.

In other embodiments, the DDFET may be replaced by a distributed resistive element without a control gate or with a minimally effective control gate. In those embodiments the deselect drivers behave as conducting elements whose characteristics in array operations may be modulated by controlling the source supplies such as $V_{deselect}$, which may be separately controlled for odd word lines and even word lines. The characteristics of the conducting elements may be that of a distributed resistance element or that of non-linear distributed diode-like elements as two further examples. These elements may be created using the process layers used for the CMOS circuitry such as the select drivers 122 in some embodiments.

In other embodiments the conducting elements may be created using the process layers used for the memory array 110 and may also be positioned as a part of the memory array 110 structure with modified memory elements acting as the conducting elements. In such embodiments, the function of the deselect drivers may be accomplished by a dedicated column or columns of modified memory elements in the case of word-line drivers or a dedicated row or rows of modified memory elements in the case of bit-line drivers. Modulation of the conductance of these array-based deselect elements can then be done through the $V_{deselect}$ voltage applied to the respective modified column(s) or row(s). By building the deselect elements as modified memory elements, the area impact of deselect drivers may be reduced even further.

For the purposes of this specification and claims, the term "modified memory element" may refer to any circuit element that is created using at least some of the process layers used for the memory cells of the memory array 110 and built with at least one dimension matching the pitch of the memory array 110. The modified memory element may use the same materials and dopants as used for the memory cells or may use somewhat different materials, dopants, and/or dopant levels as the memory cells. One example of a modified memory cell that may be suitable for use as a conducting element for a deselect driver in some embodiments may be to include an ovonic threshold switch (OTS) but not include the portion of phase change material that may normally be used as the memory element of a phase change memory with switch (PCMS) memory cell. Another type of modified memory cell that may be suitable for use as a conducting element for a deselect driver in some embodiments may be a doped silicon n-well or p-well if the memory array 110 is built using CMOS technology.

Figure 5:
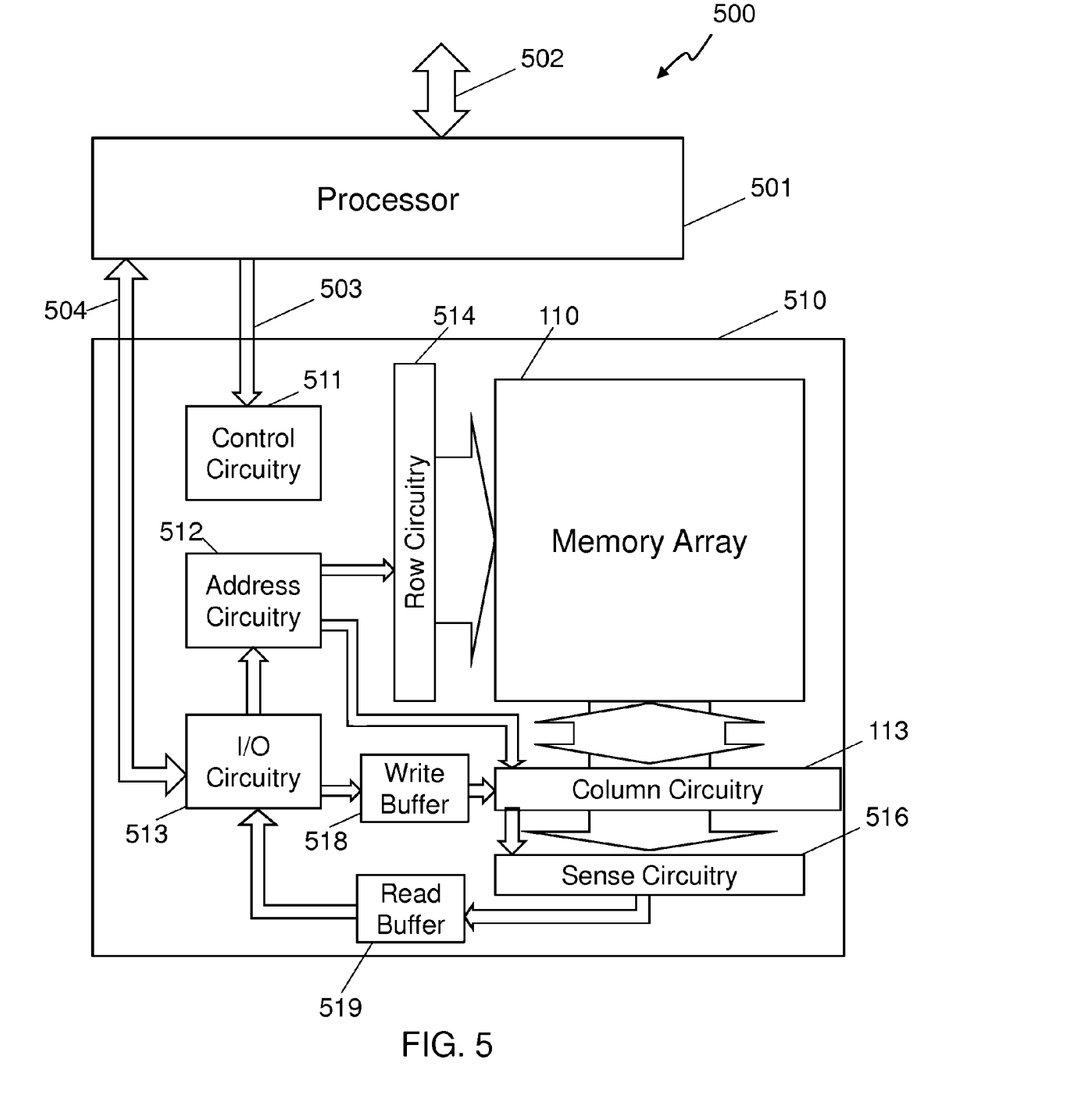
FIG. 5 is a block diagram of a system having a memory array utilizing deselect drivers in accordance with one or more embodiments.

FIG. 5 is a block diagram of a computing or storage system 500 utilizing an embodiment deselect drivers including a processor 501 coupled to a memory device 510 with control/address lines 503 and data lines 504. In some embodiments, data and control may utilize the same lines. The processor 501 may be an external microprocessor, microcontroller, or some other type of external controlling circuitry. In some embodiments, the processor 501 may be integrated in the same package or even on the same die as the memory device 510. In some embodiments, the processor 501 may be integrated with the control circuitry 511, allowing some of the same circuitry to be used for both functions. The processor 501 may have external memory, such as random access memory (RAM) and read only memory (ROM), used for program storage and intermediate data or it may have internal RAM or ROM. In some embodiments, the processor may use the memory device 510 for program or data storage. A program running on the processor 501 may implement many different functions including, but not limited to, an operating system, a file system, bad cell or block mapping, and error management The block diagram of computing or storage system 500 has been simplified to focus on features of the memory that are helpful in understanding this disclosure.

In some embodiments an external connection 502 is provided. The external connection 502 is coupled to the processor 501 and allows the processor 501 to communicate to external devices. In the case of a storage system, the external connection 502 may be used to provide an external device with non-volatile storage. The external connection 502 may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express.

The memory device 510 includes an array 110 of memory cells as discussed herein. The memory array 110 may be arranged in banks of word line rows and bit line columns with a row connecting to a respective word line 120 and a column connecting to a respective bit line 112. The memory array may also be arranged as multiple cross-point arrays stacked on top of each other. In such a three dimensional memory array, the CMOS based drivers may reside under the array, or partially under the array.

Address signals and control signals 503 may be received and decoded by control circuitry 511, I/O circuitry 513 and address circuitry 512 which may control row circuitry 514 to control the word lines 120 to the memory array 110 and column circuitry 113 to control the bit lines 112. I/O circuitry 513 may couple to the data lines 504 allowing data to be received from and sent to the processor 501. Sense circuitry 516 may be coupled to the memory array 110 and determine a logical state of selected memory cells 111 and data read from the memory array 110 may be temporarily stored in read buffers 519. The row circuitry 514 may contain various blocks of circuitry described earlier including, but not limited to, row select decode 130, row deselect decode 140, select drivers 122 and deselect drivers 124. The row circuitry and/or column circuitry, as well as other blocks within the system 500, may include various embodiments of the present subject matter.

The system illustrated in FIG. 5 has been simplified to facilitate a basic understanding of the features of the memory. Many different embodiments are possible including using a single processor 502 to control a plurality of memory devices 510 to provide for more storage space. Additional functions, such as a video graphics controller driving a monitor, and other devices for human oriented I/O may be included in some embodiments. Furthermore, processor 501 may be configured by a program of instructions, for example software, to implement claimed subject matter as discussed herein to control memory device 510 and its circuitry including row circuitry 514 and/or column circuitry 113. In such embodiments, the software may be tangibly embodied in various aspects of the devices and/or systems described herein, in or on an article of manufacture having instructions stored thereon that, if executed by a machine such as processor 501, perform aspects of various embodiments as described herein, although the scope of the claimed subject matter is not limited in this respect.

Figure 6:
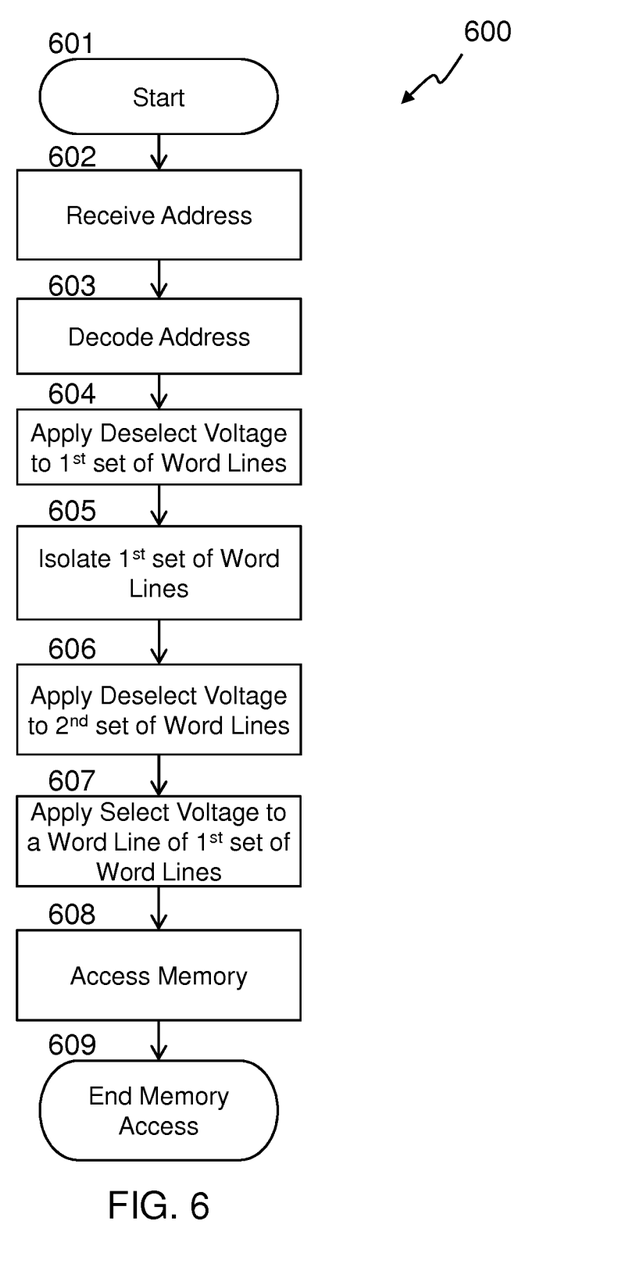
FIG. 6 is a flow chart of a method for using deselect drivers to drive memory select lines in accordance with one or more embodiments.

FIG. 6 is a flow chart 600 of an embodiment of a method for using deselect drivers 124 for driving select lines 120, 113 to a memory array 110. The method starts at block 601 and receives an address 90 at block 602. The address 90 is decoded at block 603. In some embodiments the address 90 may be separated into multiple sections, with one section of the address being used to select a particular column, or bit line 112 of the memory array 110 and another section of the address being used to select a particular row, or word line 120, of the memory array 110. In some embodiments, another section of the address 90 may be used to select a particular memory array 110 from a group of memory arrays. While the embodiment described uses the term "word lines" to describe the control lines driven to the memory array, the method may apply equally to "bit lines," or other access lines to a memory array. Each section of the address 90 may be decoded in various ways in different embodiments as described above.

At block 604, a deselect voltage may be applied to a first set of word lines 120. In some embodiments either an odd deselect control 141 or an even deselect control 142 may be driven to couple half of the word lines 120 to $V_{deselect}$. If the odd deselect control 141 is driven, the odd word lines may be coupled to $V_{deselect}$ and if the even deselect control 142 is driven, the even word lines may be coupled to $V_{deselect}$. In some embodiments, all or nearly all word lines 120 may be coupled to $V_{deselect}$ during block 604.

The first set of word lines 120 may be isolated from $V_{deselect}$ at block 605 although some embodiments may only isolate some of the first set of word lines 120. At block 606 a second set of word lines 120 may be coupled to $V_{deselect}$. In some embodiments, the second set of word lines 120 may be the word lines 120 that were not in the first set of word lines 120 so that if the first set of word lines 120 was the even word lines, the second set of word lines 120 might be the odd set of word lines 120. In other embodiments, the first set of word lines 120 may be both the even and odd word lines 120 and the second set of word lines 120 may be either the even or odd word lines 120, depending on the address 90.

At block 607, $V_{select}$ may be applied to a word line 120 in the $1^{st}$ set of word lines that is coupled to the addressed memory cell 111. Memory is accessed at block 608. During the memory access, the $2^{nd}$ set of word lines 120 is being driven to $V_{deselect}$, one word line 120 in the $1^{st}$ set of word lines 120 is being driven to $V_{select}$, and the remaining word lines 120 are held near $V_{deselect}$ by their capacitance, having been recently driven to $V_{deselect}$. The memory access ends at block 609 and the word lines 120 may be left isolated or, in some embodiments, may all or nearly all be driven back to $V_{deselect}$ as the first set of word lines 120, in anticipation of the next memory access.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the figures help to illustrate the architecture, functionality, and operation of possible implementations of systems, methods and computer program products of various embodiments. In this regard, the blocks in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that the blocks of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. Moreover, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method comprising:
    receiving an address identifying a addressed memory cell within a memory array;
    applying a deselect voltage to a first set of select lines before a memory access using deselect drivers;
    isolating at least some of the first set of select lines from a source of the deselect voltage during the memory access; and
    applying a select voltage to a select line associated with the addressed memory cell during the memory access using a select driver.

2. The method of claim 1, further comprising:
    applying the deselect voltage to a second set of select lines during the memory access;
    wherein the select line associated with the addressed memory cell is included in the at least some of the first set of select lines that are isolated from the source of the deselect voltage during the memory access.

3. The method of claim 2, wherein the second set of select lines is a subset of the first set of select lines.

4. The method of claim 2, wherein the first set of select lines and the second set of select lines are interleaved.

5. The method of claim 1, wherein a deselect driver utilizes less than about 25% as much space on an integrated circuit as the select driver.

6. The method of claim 1, wherein the deselect drivers comprise distributed drain field-effect transistors.

7. The method of claim 1, wherein the deselect drivers comprise sub-optimal transistors.

8. The method of claim 1, wherein the memory array comprises phase change memory cells, and the deselect drivers comprise modified memory elements.

9. A device comprising:
    a memory array comprising memory cells coupled to select lines;
    deselect drivers coupled to the select lines;
    select drivers coupled to the select lines;
    deselect decode circuitry to enable a first set of the deselect drivers to assert a deselect voltage on a first set of the select lines before a memory access and to isolate at least some of the first set of the select lines from a source of the deselect voltage during the memory access; and
    select decode circuitry to receive an address of an addressed memory cell and enable a select driver to assert a select voltage on a select line coupled to the addressed memory cell during the memory access.

10. The device of claim 9, the deselect decode circuitry to also assert the deselect voltage on a second set of the select lines during the memory access;
    wherein the select line coupled to the addressed memory cell is included in the at least some of the first set of select lines that are isolated from the source of the deselect voltage during the memory access.

11. The device of claim 10, wherein the first set of select lines and the second set of select lines are interleaved.

12. The device of claim 9, wherein a deselect driver utilizes less than about 25% as much space on an integrated circuit as a select driver.

13. The device of claim 9, wherein the deselect drivers comprise distributed drain field-effect transistors.

14. The device of claim 9, wherein the deselect drivers comprise sub-optimal transistors.

15. The device of claim 9, wherein the memory array comprises phase change memory cells and the deselect drivers comprise modified memory elements.

16. A system comprising:
    memory circuitry; and
    a processor capable of reading and writing data to the memory circuitry;
    wherein the memory circuitry comprises:
        a memory array comprising memory cells coupled to select lines;
        deselect drivers coupled to the select lines;
        select drivers coupled to the select lines;
        deselect decode circuitry to enable a first set of the deselect drivers to assert a deselect voltage on a first set of the select lines before a memory access and to isolate at least some of the first set of the select lines from a source of the deselect voltage during the memory access; and
        select decode circuitry to receive an address of an addressed memory cell and enable a select driver to assert a select voltage on a select line coupled to the addressed memory cell during the memory access.

17. The system of claim 16, the deselect decode circuitry to also assert the deselect voltage on a second set of the select lines during the memory access;
    wherein the select line coupled to the addressed memory cell is included in the at least some of the first set of select lines that are isolated from the source of the deselect voltage during the memory access.

18. The system of claim 17, wherein the first set of select lines and the second set of select lines are interleaved.

19. The system of claim 16, wherein a deselect driver utilizes less than about 25% as much space on an integrated circuit as a select driver.

20. The system of claim 16, wherein the deselect drivers comprise sub-optimal transistors.

* * * * *